(12) United States Patent
Machida

(10) Patent No.: US 8,513,983 B2
(45) Date of Patent: Aug. 20, 2013

(54) GATE DRIVE CIRCUIT WITH OVERDRIVE PROTECTION

(75) Inventor: Osamu Machida, Saitama (JP)

(73) Assignee: Sanken Electric Co., Ltd., Saitama (JP)

( * ) Notice: Subject to any disclaimer, the term of this patent is extended or adjusted under 35 U.S.C. 154(b) by 114 days.

(21) Appl. No.: 13/041,689

(22) Filed: Mar. 7, 2011

(65) Prior Publication Data
US 2011/0215840 A1 Sep. 8, 2011

(30) Foreign Application Priority Data
Mar. 8, 2010 (JP) ................. 2010-050420

(51) Int. Cl.
*H03K 3/00* (2006.01)

(52) U.S. Cl.
USPC ............ 327/108; 327/312; 327/318

(58) Field of Classification Search
USPC .................... 327/108, 312, 318
See application file for complete search history.

(56) References Cited

U.S. PATENT DOCUMENTS

| 7,129,759 B2* | 10/2006 | Fukami | 327/110 |
| 7,310,006 B2* | 12/2007 | Shimada | 326/83 |
| 7,596,004 B2* | 9/2009 | Grbovic | 363/21.12 |
| 7,889,529 B2* | 2/2011 | Asai | 363/132 |
| 8,063,597 B2* | 11/2011 | Thomsen | 318/400.22 |

FOREIGN PATENT DOCUMENTS

| JP | 61-101119 A | 5/1986 |
| JP | 10-163838 A | 6/1998 |
| JP | 2007-215389 | 8/2007 |

OTHER PUBLICATIONS

Office Action issued in Japanese Patent Application No. 2010-050420 on Dec. 19, 2011, plus English translation (6 pages).

* cited by examiner

*Primary Examiner* — Kenneth B. Wells
(74) *Attorney, Agent, or Firm* — Wilmer Cutler Pickering Hale and Dorr LLP

(57) ABSTRACT

A switch device comprised of a wide band gap semiconductor is provided. The switch device comprises a drain, a source, a gate and a gate voltage clamp circuit, which is connected between a signal terminal, to which a signal for driving the gate is input, and the gate through a series circuit of a capacitor and a resistance, and which comprises a diode and a voltage limiter circuit provided between the drain and the gate.

3 Claims, 7 Drawing Sheets

Rb >> Rg

R3>>R1

GATE DRIVE CIRCUIT WITH OVERDRIVE PROTECTION

CROSS-REFERENCE TO RELATED APPLICATIONS

This application claims priority from Japanese Patent Application No. 2010-050420 filed on Mar. 8, 2010, the entire subject-matter of which is incorporated herein by reference.

BACKGROUND OF THE INVENTION

1. Field of the Invention

The present invention relates to a gate drive circuit of a wide band gap semiconductor such as GaN, SiC and the like, and more particularly, to a technology enabling optimal driving of a GaNFET.

2. Description of the Related Art

A power conversion apparatus, which uses switching of a semiconductor switch for power to convert alternating current (AC) power or direct current (DC) power to AC power or DC power having a different level, is used in a UPS apparatus, an inverter for a motor, a DC-DC converter and the like.

The semiconductor switch for power has an on-resistance between a drain and a source and has been improved to a substantial theoretical value in an existing silicon device. However, in recent inverters and DC-DC converters, a novel low on-resistance device is needed so as to further improve efficiency.

Therefore, it is expected to commercialize a SiC or GaN device having potential exceeding related-art silicon devices.

Regarding this, from the related-art silicon device, a wide band gap semiconductor such as GaN, SiC and the like, i.e., a normally-off type GaNFET has been developed. A recent normally-off type FET has been developed to have a threshold voltage of 1 voltage to several voltages.

FIGS. 3A to 3C shows respective static characteristics of the normally-off type GaNFET, in which FIG. 3C shows a characteristic of a gate/source voltage versus a gate current. Regarding the characteristics of the normally-off type FET, as shown in FIG. 3C, a structure between a gate and a source is not an insulating structure such as related-art silicon MOSFET. Thus, when an excessive gate drive voltage is applied, large current flows between the gate and the source and a characteristic similar to a forward voltage of a diode is thus exhibited. Due to this, when a voltage larger than is needed is applied to the gate, power consumption of a gate drive is increased, compared to the related-art silicon MOSFET, or when current more than is needed flows in the gate, damage is caused, so that problems are caused with respect to reliability.

FIG. 10 is a circuit diagram showing an example of a gate drive circuit of a related-art silicon MOSFET. When a gate pulse signal is input, a voltage between a gate and a source is faster increased by a time constant circuit of a speedup capacitor C1 and a resistance R2, which is connected in parallel with a gate resistance R1 (refer to JP-A-10-163838).

FIG. 11 is a circuit diagram showing an example of a base drive circuit of a related-art bipolar transistor. In order to realize a high-speed switching of the bipolar transistor Qa, a method has been known in which sufficient over drive current is enabled to flow through a capacitor C1 to turn on the bipolar transistor Qa, the excessive base current is shunted to a collector by diodes D1, D2 so that the bipolar transistor Qa becomes an on-state of a non-saturated voltage, and thus accumulated charges between a base and an emitter of the bipolar transistor Qa due to the excessive base current are thus reduced to shorten a storage time period of a switching characteristic (refer to JP-A-61-101119).

However, in a semiconductor switch comprised of a high electron mobility transistor (HEMT) using the wide band gap semiconductor such as GaN, which has the characteristics of FIGS. 3A to 3C, pressure-resistance of the gate to the overvoltage is low. In addition, the characteristics between the gate and the source are similar to the forward voltage characteristics of the diode. Further, unlike the related-art silicon MOSFET, when a gate pulse voltage of about 10V is applied, the gate current is enabled to flow, so that the reliability is lowered and the gate drive voltage is increased.

When the non-saturated drive is performed as the drive circuit of the bipolar transistor, the low loss during on-time due to the low temperature resistance characteristic, which is a characteristic of the GaNFET, cannot be utilized.

SUMMARY OF THE INVENTION

An object of the invention is to relieve an over-voltage between a gate and a source and to optimize gate drive power by a simple circuit.

In order to solve the above-described problems, according to a first aspect of the invention, there is provided a switch device comprised of a wide band gap semiconductor, the switch device comprising: a drain; a source; a gate; and a gate voltage clamp circuit that is connected between a signal terminal, to which a signal for driving the gate is input, and the gate through a series circuit of a capacitor and a resistance, wherein the gate voltage clamp circuit comprises a diode and a voltage limiter circuit provided between the drain and the gate.

According to a second aspect of the invention, there is provided a gate drive circuit comprising: a switch device comprised of a wide band gap semiconductor, wherein the switch device comprising: a drain; a source; and a gate; and a signal terminal to which a signal for driving the gate is input, wherein the signal terminal is connected to an input terminal of a buffer circuit through a capacitor, an output terminal of the buffer circuit is connected to the gate terminal of the switch device through a gate resistance, and a gate voltage clamp circuit comprising a diode and a voltage limiter circuit is provided between the drain of the switch device and the input terminal of the buffer circuit.

According to a third aspect of the invention, in the gate drive circuit, wherein the buffer circuit comprises an NPN transistor and a PNP transistor, wherein base terminals of the NPN transistor and the PNP transistor are connected to each other and configure the input terminal connected to the capacitor, wherein emitter terminals of the NPN transistor and the PNP transistor are connected to each other and connected to the gate terminal of the switch terminal through the gate resistance, and wherein a collector terminal of the NPN transistor is connected to a control power source of a control circuit that generates a signal for driving the gate of the switch device, and a collector terminal of the PNP transistor is connected to a ground GND.

According to a fourth aspect of the invention, in the gate drive circuit, wherein the buffer circuit comprises an NPN transistor and a PNP transistor, wherein base terminals of the NPN transistor and the PNP transistor are connected to each other and configure the input terminal that is connected to the capacitor, wherein emitter terminals of the NPN transistor and the PNP transistor are connected to each other and connected to the gate terminal of the switch terminal through the gate resistance, wherein the switch device further comprises means for charging a control power source of a control circuit that generates a signal for driving the gate of the switch device to second and third capacitors serially connected, separating the connection to the second and third capacitors from the control power source in accordance with the signal for driving the gate of the switch device and connecting the connection point of the second and third capacitors to a ground GND, thereby making the charged voltage of the second and third capacitors as positive/negative polarity power source, and wherein a collector terminal of the NPN transistor is connected to a positive polarity voltage of the positive/negative polarity power source and a collector terminal of the PNP transistor of the buffer is connected to a negative polarity voltage of the positive/negative polarity power source.

According to a fifth aspect of the invention, the gate drive circuit further comprises a p-type MOSFET and an n-type MOSFET, wherein gate terminals of the p-type and n-type MOSFETs are connected, and the gate terminals of the p-type and n-type MOSFETs and the signal terminal are connected, wherein the other terminal of the third capacitor, which is not connected to the second capacitor, of the second and third capacitors serially connected, is connected to an anode terminal of a third diode and a cathode terminal of a fourth diode and to the ground GND through the third diode, wherein an anode terminal of the fourth diode is connected to the collector terminal of the p-type transistor of the buffer circuit and to one terminal of a fourth capacitor and to the ground GND through the fourth capacitor, and wherein the other terminal of the second capacitor, which is not connected to the third capacitor, is connected to a drain terminal of the p-type MOSFET and a collector terminal of the n-type transistor of the buffer circuit, a source terminal of the p-type MOSFET is connected to a positive pole terminal of the control power source, a drain terminal of the n-type MOSFET is connected to a connection point of the second and third capacitors and a source terminal of the n-type MOSFET is connected to the ground GND.

According to a sixth aspect of the invention, in the gate drive circuit, wherein the gate voltage clamp circuit is comprised of a serial circuit of the diode and the voltage limiter circuit consisting of the switch device comprised of the wide band gap semiconductor.

According to the invention, since the series circuit of the voltage limiter circuit and the diode is connected between the drain and the gate of the semiconductor switch, i.e., by the simple circuit, it is possible to suppress the gate over-voltage that is applied to the wide band gap semiconductor switch and to drive the gate without sacrificing the switching characteristic and the on-resistance.

DETAILED DESCRIPTION OF THE PREFERRED EMBODIMENTS

Hereinafter, illustrative embodiments of a gate drive circuit of the invention will be specifically described with reference to the drawings.

<First Illustrative Embodiment>

Figure 1:
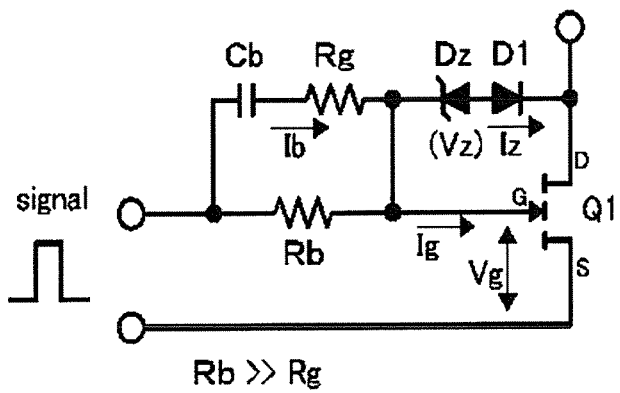
FIG. 1 is a circuit diagram showing a gate drive circuit according to a first illustrative embodiment.

FIG. 1 shows a gate drive circuit according to a first illustrative embodiment. A semiconductor switch of the first illustrative embodiment shown in FIG. 1 uses a HEMT Q1 comprised of a wide band gap semiconductor of GaN.

The HEMT Q1 has a gate G, a drain D and a source S. When a drive voltage is gradually applied between the gate and the source, gate current starts to flow, as a characteristic of a diode, at a gate voltage that exceeds a threshold gate voltage and reaches a saturated voltage between the drain and the source.

In the configuration of the first illustrative embodiment, a signal terminal of the gate drive circuit, to which a control signal over the semiconductor switch Q1 is input, is connected to a gate terminal of the semiconductor switch Q1 through a circuit in which a series circuit consisting of a capacitor Cb and a resistance Rg is connected in parallel with a bias resistance Rb. A cathode of a zener diode Dz is connected to the gate terminal of the semiconductor switch Q1. An anode of a diode D1 is connected to an anode of the zener diode Dz and is connected to a drain terminal of the semiconductor switch Q1 via the diode D1.

Figure 2:
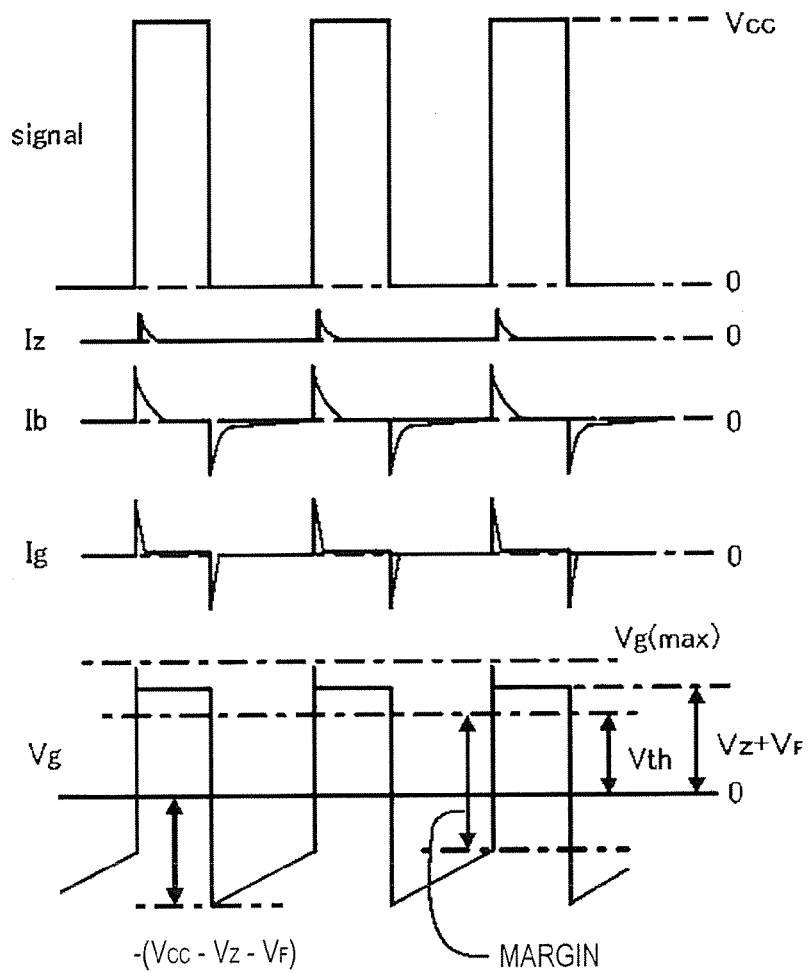
FIG. 2 shows gate voltage waveforms of the first illustrative embodiment.
Figure 3A:
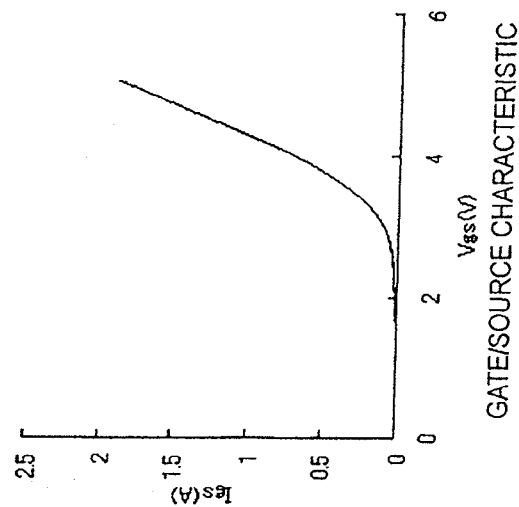
FIGS. 3A to 3C show representative static characteristics of a normally-off type GaNFET, respectively.
Figure 3B:
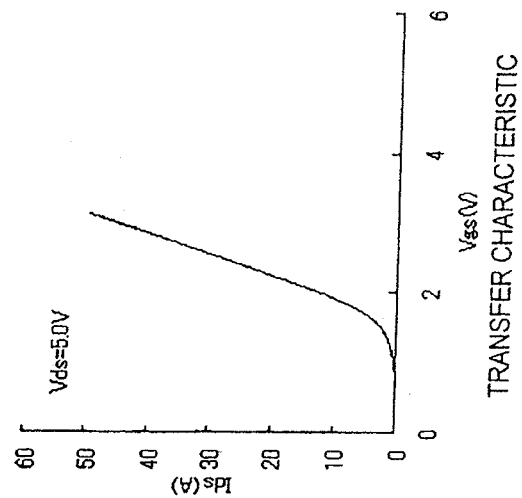
Figure 3C:
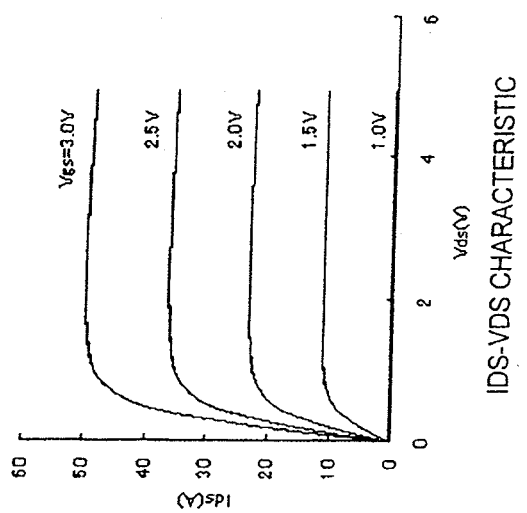

FIG. 2 shows gate voltage waveforms of the first illustrative embodiment.

When the control signal is input to the semiconductor switch Q1, a voltage is applied to the gate terminal of the semiconductor switch Q1 through the series circuit consisting of the capacitor Cb and the resistance Rg and the semiconductor switch Q1 becomes on. In other words, drive current is supplied from the series circuit of the capacitor Cb and the resistance Rg and the bias resistance Rb to the zener diode Dz and the diode D1 connected between the gate and drain terminals of the semiconductor switch Q1. Thereby, the drive current is supplied to a capacitance (not shown) between the gate and the source of the semiconductor switch Q1, so that a gate voltage Vg is increased to turn on the semiconductor switch Q1.

Here, a drain voltage of the semiconductor switch Q1 reaches a saturated voltage and thus becomes about 0V. Therefore, the gate voltage of the semiconductor switch Q1 is clamped with an added voltage of a zener voltage Vz of the zener diode Dz and a forward voltage VF of the diode D1, so that a gate voltage clamp circuit is configured. Accordingly, an over-voltage that exceeds a maximum gate voltage Vg(max) is not applied to the gate terminal of the semiconductor switch Q1. In the meantime, the clamp voltage by the zener voltage Vz of the zener diode Dz and the forward voltage VF of the diode D1 is set to be a threshold gate voltage or higher of the semiconductor switch Q1 or higher so that an on-state of the semiconductor switch Q1 becomes a saturated voltage.

In addition, when the control signal becomes 0V, regarding the voltage charged in the capacitor Cb, when an H level voltage of the control signal is indicated with Vcc, a voltage obtained by subtracting the zener voltage Vz of the zener diode Dz and the forward voltage VF of the diode D1 from the voltage Vcc becomes an inverse bias voltage and is thus generated. Therefore, the inverse bias voltage of -(Vcc-Vz-VF) is applied to the gate terminal. A differential voltage between the inverse bias voltage and the threshold gate voltage becomes a margin for preventing an operation of the semiconductor switch Q1 until an H level voltage of a next control signal is input while the bias resistance Rb and the resistance Rb become loads and thus the charged voltage of the capacitor Cb is discharged.

<Second Illustrative Embodiment>

Figure 4:
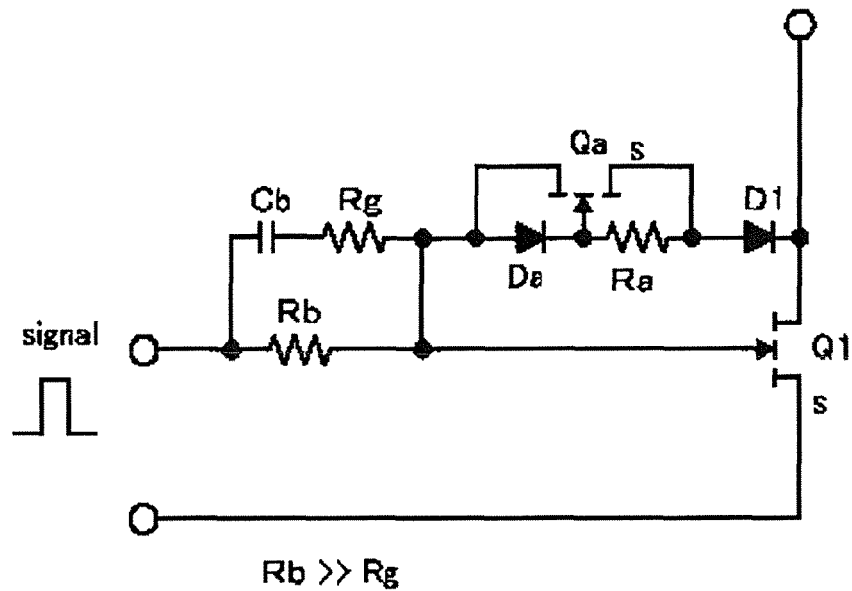
FIG. 4 is a circuit diagram showing a gate drive circuit according to a second illustrative embodiment.
Figure 5:
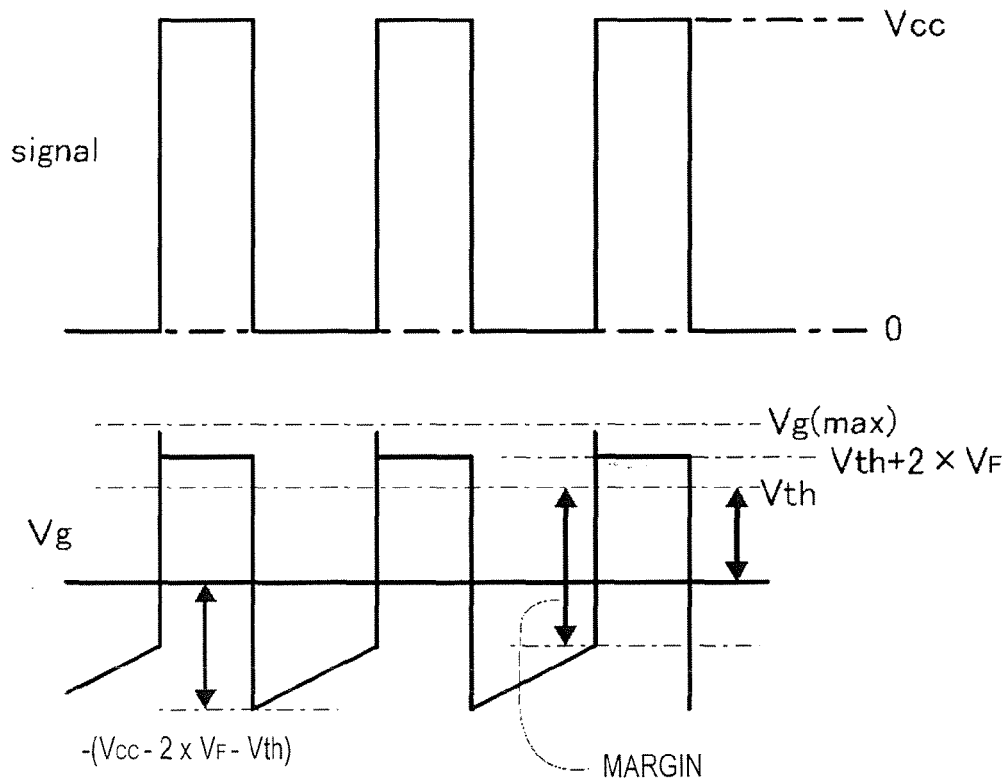
FIG. 5 shows gate voltage waveforms of the second illustrative embodiment.

FIGS. 4 and 5 show a gate drive circuit of a second illustrative embodiment of the invention and operation waveforms thereof. In FIGS. 4 and 5, the substantially same parts as those of FIGS. 1 and 2 are indicated with the same reference numerals and the descriptions thereof will be omitted.

In the gate drive circuit shown in FIG. 4, the zener diode Dz of FIG. 1 is replaced by a circuit in which a diode Da is connected between a drain and a gate of GaNFET Qa, which is the semiconductor switch as that of the semiconductor switch Q1, thereby setting a clamp voltage. In other words, an anode of the diode Da is connected to the drain terminal of GaNFET Qa, and a cathode of the diode Da is connected to the gate terminal, so that it is possible to acquire a zener characteristic of the threshold gate voltage plus the forward voltage VF of the diode Da. Accordingly, the gate voltage of the semiconductor switch Q1 is clamped at the voltage of the threshold voltage plus 2 VF.

The semiconductor switches Q1, Qa are configured on a same chip, so that the same characteristic can be provided and are changed, like the temperature characteristic of the threshold gate voltage, and the like. Accordingly, it is possible to reduce an inherent non-uniformity of the threshold gate voltage and the zener voltage of the zener diode Dz, a difference of the temperature characteristics and the like. In the meantime, it may be possible that the diode Da is replaced with a resistance and thus the clamp voltage is set by a partial pressure due to the resistance. In this case, the temperature characteristic of the forward voltage of the diode Da is decreased.

<Third Illustrative Embodiment>

Figure 6:
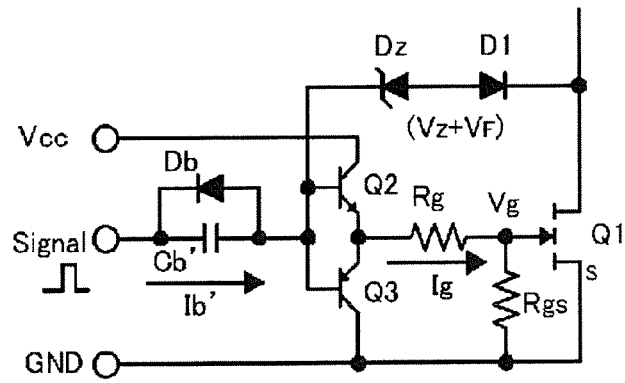
FIG. 6 is a circuit diagram showing an example of a gate drive circuit according to a third illustrative embodiment.
Figure 7:
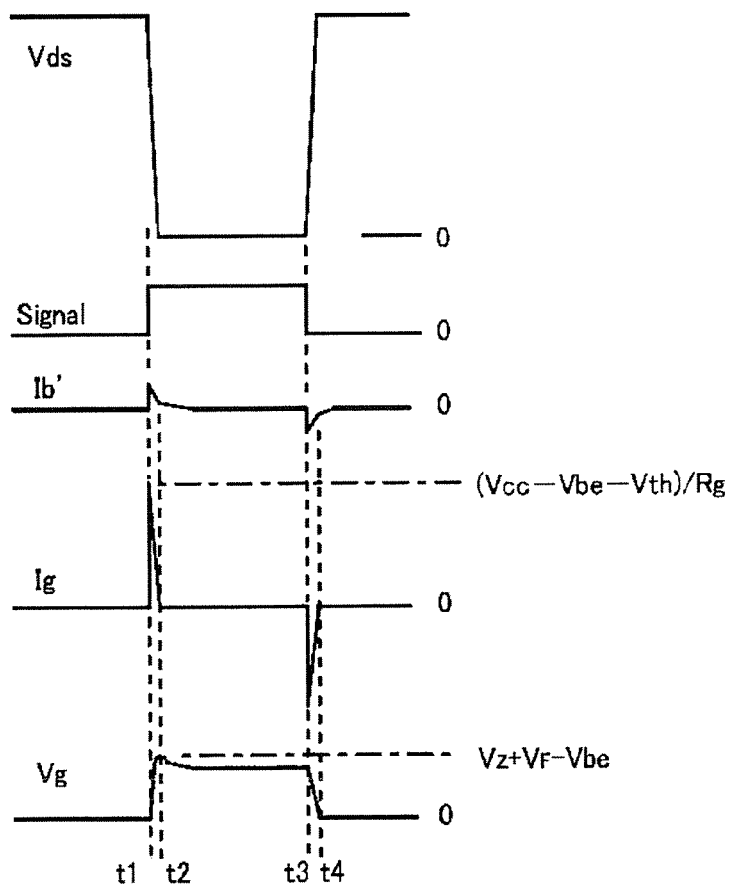
FIG. 7 shows gate voltage waveforms of the third illustrative embodiment.

FIGS. 6 and 7 show a gate drive circuit of a third illustrative embodiment of the invention and operation waveforms thereof.

In the gate drive circuit shown in FIG. 6, the control signal is input to a base terminal of a buffer consisting of transistors Q2, Q3 through a capacitor Cb' and an over-drive of the control signal is clamped between the gate and the source of the semiconductor switch Q1 through the zener diode Dz and the diode D1.

The third illustrative embodiment is configured as follows. The terminal of the control signal over the semiconductor switch Q1 is connected to an anode terminal of a diode Db, a base terminal of an NPN transistor Q2 and a base terminal of a PNP transistor Q3, which transistors configure a buffer circuit, and the cathode terminal of the zener diode Dz through a parallel circuit consisting of the capacitor Cb' and the diode Db, the anode terminal of the zener diode Dz and the anode terminal of the diode D1 are connected, and the cathode terminal of the diode D1 and the drain terminal of the semiconductor switch Q1 are connected.

In addition, an emitter terminal of the NPN transistor Q2 and an emitter terminal of the PNP transistor Q3 are connected to one terminal of a gate resistance Rg, and the other terminal of the gate resistance Rg, the gate terminal of the semiconductor switch Q1 and one terminal of a resistance Rgs between the gate and the source of the semiconductor switch are connected.

A collector terminal of the NPN transistor Q2 is connected to a voltage Vcc terminal of a control power source (not shown), and a collector terminal of the PNP transistor Q3, the source terminal of the semiconductor switch Q1 and the other terminal of the resistance Rgs between the gate and the source of the semiconductor switch are connected to a ground GND terminal.

Detailed operations of the third illustrative embodiment will be described. In FIG. 7 showing the operation waveforms of the third illustrative embodiment, when the control signal of an H level (a level of a voltage Vcc of a control power source (not shown)) is input at a time t1, the base current of the NPN transistor Q1 is enabled to flow through the capacitor Cb', so that the NPN transistor Q2 becomes on and the gate voltage Vg is applied to the gate terminal of the semiconductor switch Q1 through the gate resistance Rg. Here, since there exists capacitance between the gate and the source of the semiconductor switch Q1, gate current Ig amplified by the NPN transistor Q2 is enabled to flow.

At the same time, the semiconductor transistor Q1 is shifted to the on-state, the drain voltage reaches an on-state at a time t2 and the gate current Ig becomes 0 (zero). Here, since the capacitor Cb' is not completely charged, the gate current Ig flows to the drain terminal of the semiconductor switch Q1 through the zener diode Dz and the diode D1 after the time t2. Accordingly, as the gate terminal voltage of the semiconductor switch Q1, a differential voltage between the voltage having added the zener voltage Vz and the forward voltage VF of the diode D1 and the voltage between the base and the emitter of the NPN transistor Q2 is applied, so that an overvoltage exceeding the maximum gate voltage Vg(max) of the semiconductor switch Q1 is not applied.

Then, when the control signal having a zero (0) level is input at a time t3, the NPN transistor Q2 becomes off through the capacitor Cb' and the base current of the PNP transistor Q3 is enabled to flow and the PNP transistor Q3 becomes thus on, so that the gate terminal of the semiconductor switch Q1 becomes 0V through the gate resistance Rg. Here, since there exists the capacitance between the gate and the source of the semiconductor switch Q1, as described above, the gate current Ig is enabled to flow in the reverse direction to the on-state by the PNP transistor Q3, so that the semiconductor switch Q1 becomes off. In the meantime, after a time t4, the capacitor Cb' is discharged through the resistance Rgs between the gate and the source of the semiconductor switch Q1.

In the meantime, the diode Db is a protecting diode so that the semiconductor switch Q1 under no control signal such as power input is not turned on by malfunction such as noise. It is preferable to select a diode having a low forward voltage. Alternatively, the diode may be replaced with a resistance.

According to the third illustrative embodiment, the gate of the semiconductor switch Q1 is driven through the buffer of the transistors Q2, Q3, so that the capacitance of the capacitor Cb' can be further reduced remarkably in proportion to a reciprocal of a transistor amplification factor, compared to the capacitance of the capacitor Cb of the first and second illustrative embodiments.

Therefore, it is possible to reduce the drive power of the control signal. Further, the over-drive current from the capacitor Cb' is enabled to flow to the clamp circuit consisting of the zener diode Dz and the diode D1, so that it is possible to suppress the gate terminal voltage of the semiconductor switch Q1 to the drive power optimized for driving.

<Illustrative Embodiment 4>

Figure 8:
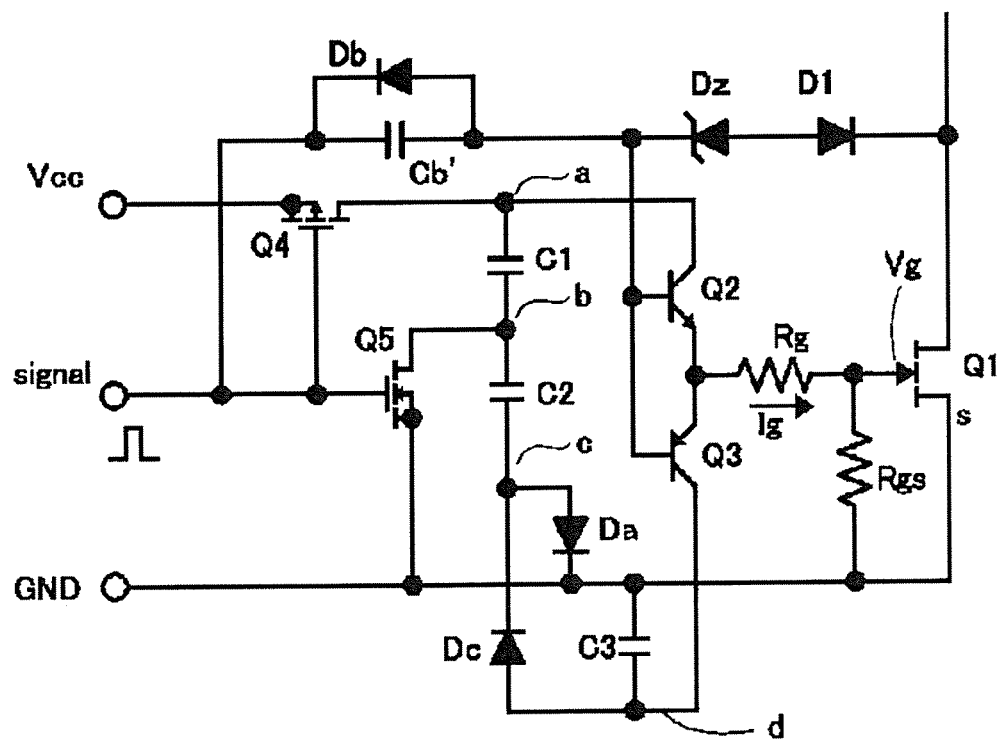
FIG. 8 is a circuit diagram showing an example of a gate drive circuit according to a fourth illustrative embodiment.
Figure 9:
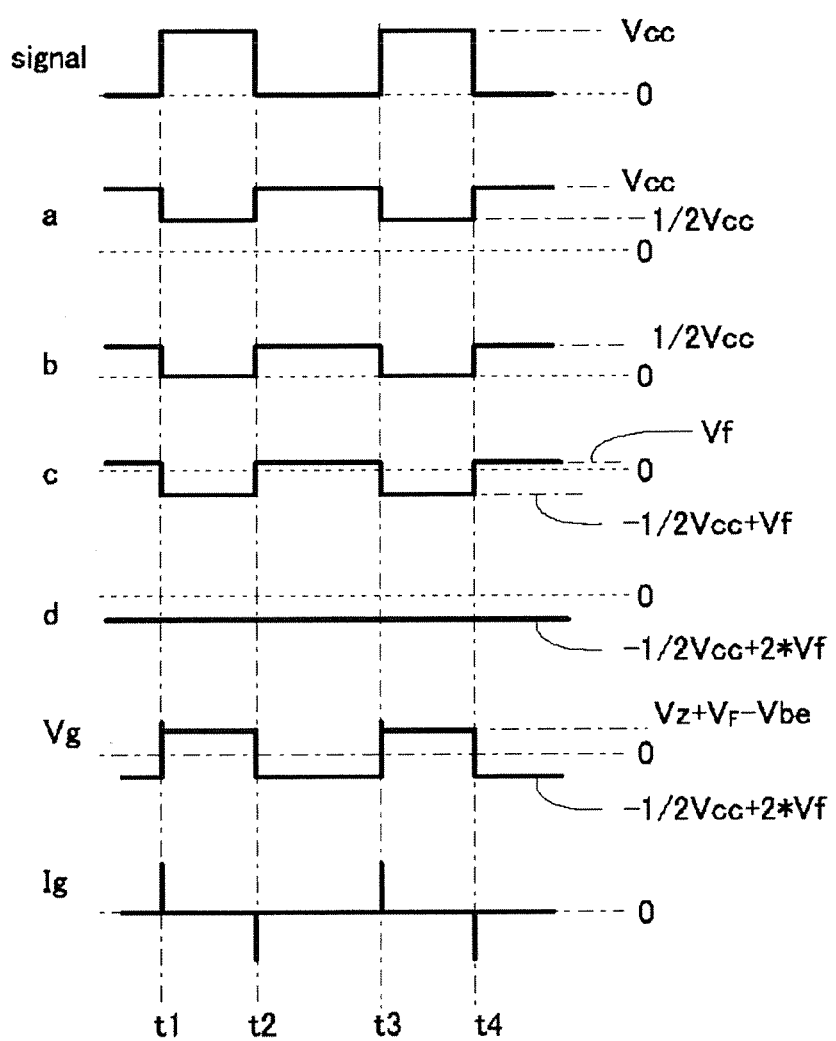
FIG. 9 shows gate voltage waveforms of the fourth illustrative embodiment.
Figure 10:
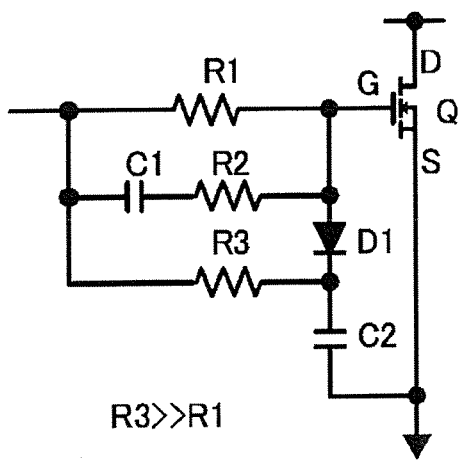
FIG. 10 is a circuit diagram showing an example of a drive circuit of a related-art silicon MOSFET.
Figure 11:
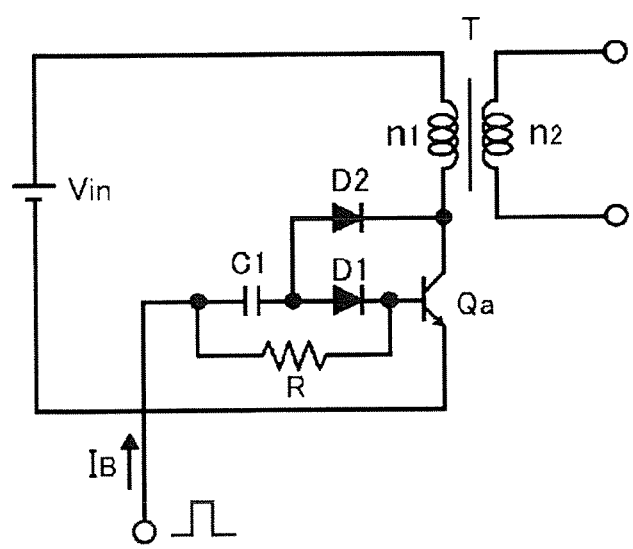
FIG. 11 is a circuit diagram showing an example of a drive circuit of a related-art bipolar transistor.

FIGS. 8 and 9 show a gate drive circuit of a fourth illustrative embodiment of the invention and operation waveforms thereof. In FIGS. 8 and 9, the substantially same parts as those of FIGS. 6 and 7 are indicated with the same reference numerals and the descriptions thereof will be omitted.

The gate drive circuit shown in FIG. 8 divides the voltage Vcc of the control power source (not shown) by a half (½), as a power source voltage of a buffer consisting of the transistors in addition to the third illustrative embodiment, and thus generates ±power sources, which are the power source voltages of the buffer.

The fourth illustrative embodiment is configured as follows. A signal terminal of the gate drive circuit, to which control signal over the semiconductor switch Q1 is input, is connected, through a parallel circuit consisting of the capacitor Cb' and the diode Db, to the anode terminal of the diode Db, the base terminal of the NPN transistor Q2 and the base terminal of the PNP transistor Q3, which transistors configure a buffer circuit, and the cathode terminal of the zener diode Dz, the anode terminal of the zener diode Dz and the anode terminal of the diode D1 are connected and the cathode terminal of the diode D1 and the drain terminal of the semiconductor switch Q1 are connected.

In addition, the emitter terminal of the NPN transistor Q2, the emitter terminal of the PNP transistor Q3 and one terminal of the gate resistance Rg are connected and the other terminal of the gate resistance Rg is connected to the gate terminal of the semiconductor switch Q1 and one terminal of the resistance Rgs between the gate and the source.

The voltage Vcc terminal of the control power source (not shown) is connected to a source terminal of a p-type MOSFET Q4, a drain terminal of the MOSFET Q4 is connected to one terminal of a capacitor C1 and the collector terminal of the NPN transistor Q2, the other terminal of the capacitor C1 is connected to one terminal of a capacitor C2 and a drain terminal of a n-type MOSFET Q5, the other terminal of the capacitor C2 is connected to the anode terminal of the diode Da and a cathode terminal of a diode Dc, and the cathode terminal of the diode Da and the other terminal of the gate resistance Rgs are connected to the ground GND terminal. An anode terminal of the diode Dc is connected to one terminal of the capacitor C3 and the collector terminal of the PNP transistor Q3.

A gate terminal of the p-type MOSFET Q4 is connected to a gate terminal of the n-type MOSFET Q5, one terminal of the capacitor Cb', the cathode terminal of the diode Db and the control signal terminal. The source terminal of the semiconductor switch, a source terminal of the n-type MOSFET Q5, the other terminal of the resistance Rgs between the gate and the source and the other terminal of the capacitor C3 are connected to the GND terminal.

Detailed operations of the third illustrative embodiment will be described with reference to FIG. 9. In FIG. 9 showing the operation waveforms of the fourth illustrative embodiment, when the control signal of an H level (a level of a voltage Vcc of the control power source (not shown)) is input at a time t1, the base current of the NPN transistor Q2 is enabled to flow through the capacitor Cb', so that the NPN transistor Q2 becomes on and the gate voltage Vg is applied to the gate terminal of the semiconductor switch Q1 through the gate resistance Rg. Here, since there exists capacitance between the gate and the source of the semiconductor switch Q1, the gate current Ig amplified by the NPN transistor Q2 is enabled to flow.

At the same time, the semiconductor switch Q1 is shifted to an on-state and the drain voltage is saturated. Here, the non-charged part of the capacitor Cb' flows to the drain terminal of the semiconductor switch Q1 through the zener diode Dz and the diode D1. Accordingly, as the gate terminal voltage of the semiconductor switch Q1, a differential voltage between the voltage having added the zener voltage Vz and the forward voltage VF of the diode D1 and the voltage between the base and the emitter of the NPN transistor Q2 is applied, so that an over-voltage exceeding the maximum gate voltage Vg(max) of the semiconductor switch Q1 is not applied.

In addition, since the gate terminal of the p-type MOSFET Q4 has a zero (0) level before the time t1, the p-type MOSFET Q4 is under on-state and the voltage Vcc of the control power source (not shown) is applied to the capacitors C1, C2 and the diode Da. The capacitances of the capacitors C1, C2 are set to be same, the capacitor C3 is set to have the capacitance smaller than those of the capacitors C1, C2 and also to have the capacitance that is sufficiently greater than the capacitance between the gate and the source of the semiconductor switch Q1, which is not shown.

When the control signal of an H level is input at the time t1, the p-type MOSFET Q4 is off and the n-type MOSFET Q5 is shifted to an on-state from an off-state. As the p-type MOSFET Q4 is off, the one terminal of the capacitor C1 is separated from the voltage Vcc terminal of the control power source, and the connection point of the capacitors C1, C2 is connected to the ground GND terminal as the n-type MOSFET Q5 is on.

Accordingly, the one terminal voltage a of the capacitor C1 becomes ½Vcc voltage during the time t1 to t2, and the other terminal voltage c of the capacitor C2 becomes −½Vcc+VF voltage from the forward voltage VF of the diode Da and charges the capacitor C3 through the diode Dc. A voltage of a point d of the capacitor C3 is −½Vcc+2×VF when the forward voltage of the diodes Da, Dc is indicated with VF.

Therefore, since the collector voltage of the NPN transistor Q2 becomes the voltage of the point a and ½ voltage of the voltage Vcc of the control power source, it is possible to reduce the gate drive voltage of the semiconductor switch Q1. In other words, although the voltage Vcc of the control power source is generally set to be about 12V to 15V, the threshold gate voltage of the normally-off type GaNFET is low such as about 1V to 3V, which is a relatively high voltage as the drive voltage. Here, the voltage Vcc of the control power source is divided to ½ voltage, which is set as the drive voltage. As a result, it is possible to save the energy of the drive power.

Then, when the control signal of a zero level is input at a time t2, the base current of the PNP transistor Q3 is enabled to flow through the capacitor Cb', so that PNP transistor Q3 becomes on and the gate terminal of the semiconductor switch Q1 is biased to the potential of the point d through the gate resistance Rg. Here, since there exists the capacitance between the gate and the source of the semiconductor switch Q1, the gate current Ig is enabled to flow in a reverse direction to the on-state by the PNP transistor Q3, so that semiconductor switch Q1 becomes off.

In the meantime, the voltage of the point d, which is the collector of the PNP transistor Q3, is a negative voltage, and the negative voltage of (−½Vcc+2×VF) is applied, as the gate voltage of the semiconductor switch Q1, during the time period of t2 to t3. Accordingly, even when the threshold gate voltage of the semiconductor switch Q1 is low, it is possible to sufficiently secure a margin of noise.

Like this, according to the gate drive circuits of the first to fourth illustrative embodiments, the zener diode Dz and the diode D1 are connected between the gate and the drain of the semiconductor switch Q1, so that it is possible to suppress the over-voltage of the gate terminal. In addition, according to the first, second and fourth illustrative embodiments, since it is possible to apply the negative voltage to the gate terminal when the semiconductor switch Q1 is off, it is possible to sufficiently secure a margin of noise even when the threshold gate voltage of the semiconductor switch Q1 is low.

The invention can be applied to a UPS apparatus, an inverter for a motor, a DC-DC converter and the like.

What is claimed is:

1. A gate drive circuit comprising:
    a switch device comprised of a wide band gap semiconductor, the switch device comprising:
        a drain;
        a source; and
        a gate;
    a signal terminal, to which a signal for driving the gate is input;
    a first resistance connected between the gate and the signal terminal;
    a series circuit of a capacitor and a second resistance connected between the gate and the signal terminal; and
    a gate voltage clamp circuit, which comprises a diode and a voltage limiter circuit, and which is provided between the drain and the gate,
    wherein the signal terminal is connected to the gate through a circuit in which the series circuit is connected in parallel with the first resistance.

2. The gate drive circuit according to claim 1, wherein the gate voltage clamp circuit is comprised of a serial circuit of the diode and the voltage limiter circuit consisting of the switch device comprised of the wide band gap semiconductor.

3. The gate drive circuit according to claim 1, wherein the first resistance has a resistance value greater than the second resistance.

* * * * *